(12) United States Patent
Li et al.

(10) Patent No.: US 11,997,879 B2
(45) Date of Patent: May 28, 2024

(54) ARRAY SUBSTRATE, DISPLAY PANEL, AND DISPLAY DEVICE FOR IMPROVING DISPLAY EFFECT

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Pan Li, Beijing (CN); Xueguang Hao, Beijing (CN); Yongda Ma, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 592 days.

(21) Appl. No.: 17/272,948

(22) PCT Filed: Jul. 30, 2020

(86) PCT No.: PCT/CN2020/105840
§ 371 (c)(1),
(2) Date: Mar. 3, 2021

(87) PCT Pub. No.: WO2021/036676
PCT Pub. Date: Mar. 4, 2021

(65) Prior Publication Data
US 2022/0052138 A1 Feb. 17, 2022

(30) Foreign Application Priority Data
Aug. 26, 2019 (CN) .......................... 201921388079.4

(51) Int. Cl.
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/131* (2023.02)

(58) Field of Classification Search
CPC ........... H10K 59/1213; H10K 59/1216; H10K 59/131; H10K 71/861; H10K 50/81; H10K 50/813; H10K 59/123
(Continued)

(56) References Cited

U.S. PATENT DOCUMENTS

| 8,933,459 B2* | 1/2015 | Yoon | H10K 59/1213 |
| | | | 438/149 |
| 2008/0088543 A1* | 4/2008 | Shibusawa | G09G 3/325 |
| | | | 345/55 |

(Continued)

FOREIGN PATENT DOCUMENTS

| CN | 103941507 A | 7/2014 |
| CN | 105762156 A | 7/2016 |

(Continued)

OTHER PUBLICATIONS

Extended European search report of counterpart European application No. 20858801.2 dated Sep. 28, 2022.

*Primary Examiner* — Kimberly N Rizkallah
*Assistant Examiner* — Pratiksha Jayant Lohakare
(74) *Attorney, Agent, or Firm* — Lippes Mathias LLP

(57) ABSTRACT

An array substrate is provided. The array substrate includes a plurality of pixel drive circuits. The plurality of pixel drive circuits include a first pixel drive circuit and a second pixel drive circuit that are adjacent to each other. The first electrode plate of the first pixel drive circuit and the pixel electrode of the second pixel drive circuit are laminated in an overlapping region and isolated by the insulating layer.

18 Claims, 9 Drawing Sheets

(58) Field of Classification Search
USPC ........................................................... 257/40
See application file for complete search history.

(56) References Cited

U.S. PATENT DOCUMENTS

| | | | |
|---|---|---|---|
| 2014/0131672 A1* | 5/2014 | Yoon | H10K 59/1216 |
| | | | 438/34 |
| 2015/0287741 A1 | 10/2015 | Wang et al. | |
| 2016/0148989 A1* | 5/2016 | Jin | H10K 59/1216 |
| | | | 257/40 |
| 2016/0189593 A1* | 6/2016 | Lee | G09G 3/003 |
| | | | 438/4 |
| 2016/0197130 A1 | 7/2016 | Gil et al. | |
| 2017/0263653 A1 | 9/2017 | Lu et al. | |
| 2018/0323251 A1* | 11/2018 | Gang | H10K 59/126 |
| 2020/0013992 A1* | 1/2020 | Cheng | H10K 50/84 |
| 2020/0052008 A1 | 2/2020 | Chi et al. | |

FOREIGN PATENT DOCUMENTS

| | | |
|---|---|---|
| CN | 110137187 A | 8/2019 |
| CN | 210073855 U | 2/2020 |
| KR | 20160083532 A | 7/2016 |
| WO | 2019042474 A1 | 3/2019 |

\* cited by examiner

ARRAY SUBSTRATE, DISPLAY PANEL, AND DISPLAY DEVICE FOR IMPROVING DISPLAY EFFECT

The present disclosure is a 371 of PCT Application No. PCT/CN2020/105840, filed on Jul. 30, 2020, which claims priority to Chinese Utility Model Patent Application No. 201921388079.4, filed on Aug. 26, 2019 and entitled "ARRAY SUBSTRATE, DISPLAY PANEL, AND DISPLAY DEVICE," the entire content of which is incorporated herein by reference.

TECHNICAL FIELD

The present disclosure relates to the field of display technology, and in particular, relates to an array substrate, a display panel, and a display device.

BACKGROUND

Organic light-emitting diode (OLED) display devices are increasingly used in high-performance display panels due to the characteristics of low power consumption, self-illumination, fast response, and wide viewing angle.

The information disclosed in this background part is merely used for enhancing the understanding of the background of the present disclosure, and therefore, may include information that does not constitute related arts known to persons of ordinary skill in the art.

SUMMARY

The present disclosure provides an array substrate, a display panel, and a display device.

According to one aspect of the present disclosure, an array substrate is provided. The array substrate includes a plurality of pixel drive circuits, wherein each of the pixel drive circuits includes:

a drive transistor comprising a drain;

a storage capacitor comprising a first electrode plate, wherein the first electrode plate is connected to the drain of the drive transistor; drive transistor, and a second pixel drive circuit that are adjacent to each other, wherein the first electrode plate of the first pixel drive circuit and the pixel electrode of the second pixel drive circuit are laminated in an overlapping region and isolated by the insulating layer.

In an exemplary embodiment of the present disclosure, the first pixel drive circuit and the second pixel drive circuit are arranged along an extending direction of a data line of the array substrate; or the first pixel drive circuit and the second pixel drive circuit are arranged along an extending direction of a gate line of the array substrate.

In an exemplary embodiment of the present disclosure, the plurality of pixel drive circuits further include at least one of a third pixel drive circuit, a fourth pixel drive circuit, and a fifth pixel drive circuit that are adjacent to the first pixel drive circuit; wherein the second pixel drive circuit, the first pixel drive circuit, and the third pixel drive circuit are arranged successively along an extending direction of a data line of the array substrate;

the fourth pixel drive circuit, the first pixel drive circuit, and the fifth pixel drive circuit are arranged successively along an extending direction of a gate line of the array substrate;

the pixel electrode of the first pixel drive circuit and the first electrode plate of the third pixel drive circuit are further laminated in an overlapping region and isolated by the insulating layer;

the first electrode plate of the first pixel drive circuit and the pixel electrode of the fourth pixel drive circuit are further laminated in an overlapping region and isolated by the insulating layer; and the pixel electrode of the first pixel drive circuit and the first electrode plate of the fifth pixel drive circuit are further laminated in an overlapping region and isolated by the insulating layer.

In an exemplary embodiment of the present disclosure, the plurality of pixel drive circuits further include at least one of a third pixel drive circuit, a fourth pixel drive circuit, that are wherein the second pixel drive circuit, the first pixel drive circuit, and the fifth pixel drive circuit are arranged successively along an extending direction of a gate line of the array substrate;

the first electrode plate of the first pixel drive circuit is laminated in different overlapping regions with the pixel electrode of the third pixel drive circuit, the pixel electrode of the fourth pixel drive circuit, and the pixel electrode of the fifth pixel drive circuit and isolated by the insulating layer.

In an exemplary embodiment of the present disclosure, the first electrode plate includes a first connecting lead, and the pixel electrode includes a second connecting lead;

wherein the first connecting lead of the first pixel drive circuit and the second connecting lead of the second pixel drive circuit are laminated in the overlapping region and isolated by the insulating layer.

In an exemplary embodiment of the present disclosure, the array substrate further includes a compensation line;

wherein each of the pixel drive circuits further includes a compensation transistor, a drain of the compensation transistor is connected to the first connecting lead, and a source of the compensation transistor is connected to the compensation line.

In an exemplary embodiment of the present disclosure, the array substrate further includes a base substrate; wherein the first connecting lead of the first pixel drive circuit is arranged on a side of the base substrate;

the insulating layer is arranged on a side, distal from the base substrate, of the first connecting lead of the first pixel drive circuit; and the second connecting lead of the second pixel drive circuit is arranged on a side, distal from the base substrate, of the insulating layer;

In an exemplary embodiment of the present disclosure, the array substrate further includes:

a planarization layer, arranged between the insulating layer and the second connecting lead of the second pixel drive circuit, wherein the planarization layer has a first via hole exposing the insulating layer; wherein the second connecting lead of the second pixel drive circuit covers the insulating layer exposed by the first via hole.

In an exemplary embodiment of the present disclosure, the array substrate further includes:

an active material layer, arranged on a side of the base substrate, wherein the active material layer includes a second electrode plate of the storage capacitor and an active layer of the drive transistor;

a first insulating material layer, arranged on a side, distal from the base substrate, of the active material layer, wherein the first insulating material layer includes a dielectric layer of the storage capacitor and a gate insulating layer of the drive transistor side, distal from the base substrate, of the first insulating material layer, wherein the gate material layer includes a gate of the drive transistor and the first electrode plate of the storage capacitor;

a source/drain material layer, arranged on a side, distal from the base substrate, of the gate material layer, wherein the source/drain material layer includes drive transistor;

a second insulating material layer, arranged on the side, distal from the base substrate, of the gate material layer, wherein the second insulating material layer includes a protective layer including the insulating layer;

a third insulating material layer, arranged on a side, distal from the base substrate, of the second insulating material layer, wherein the third insulating material layer includes the planarization layer; and an electrode material layer, arranged on a side, distal from the base substrate, of the planarization layer distant, wherein the electrode material layer includes the pixel electrode.

In an exemplary embodiment of the present disclosure, the pixel drive circuit further includes: a data writing transistor; wherein a drain of the data writing transistor is connected to a gate of the drive transistor and the second electrode plate of the storage capacitor.

In an exemplary embodiment of the present disclosure, the array substrate includes a plurality of pixels, wherein each of the pixels includes a pixel drive circuit and a light emitting element connected to the pixel drive circuit.

According to another aspect of the present disclosure, a display panel is provided. The display panel includes the array substrate as described above and a packaging film configured to package the array substrate.

According to still another aspect of the present disclosure, a display device is provided. The display device includes the display panel as described above and a drive circuit connected to the display panel.

BRIEF DESCRIPTION OF THE DRAWINGS

The above-mentioned and other features and advantages of the present disclosure become more apparent by description in detail of some exemplary embodiment with reference to the accompanying drawings.

Figure 1:
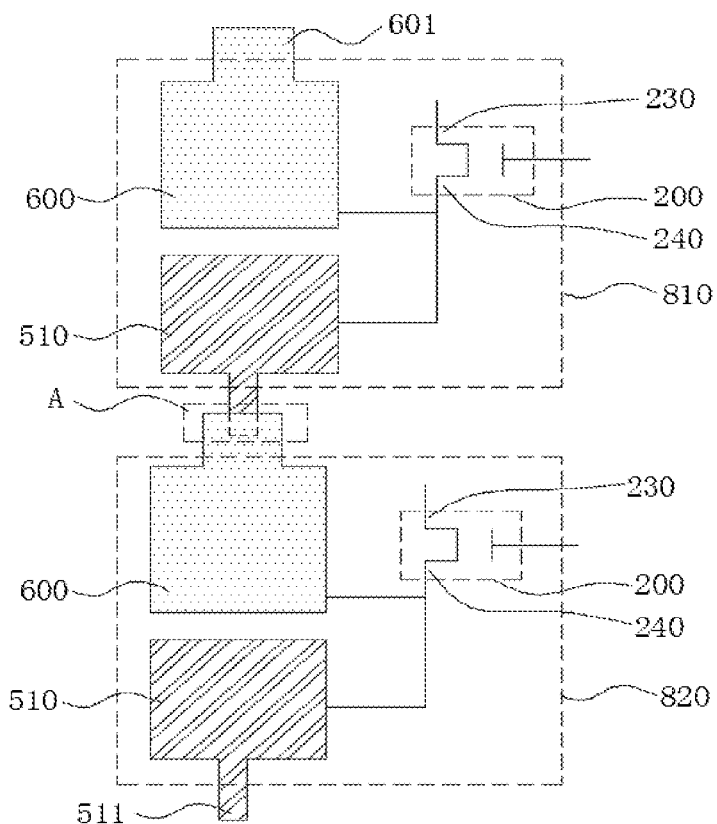
FIG. 1 is a schematic structural diagram of an array substrate according to an embodiment of the present disclosure.

Reference numerals of the main components in the drawings are as follows:

110: base substrate; 120: first insulating material layer; 131: first gate line; 132: second gate line; 133: fourth connecting lead; 141: data line; 142: compensation line; 143: power line; 144: third connecting lead; 150: protective layer; 160: planarization layer; 200: drive transistor; 210: active layer of drive; 212: source contact region of drive transistor; 213: drain contact region of drive transistor; 220: gate layer of drive transistor; 230: source of drive transistor; 240: drain of drive transistor; 300: compensation transistor; 310: active layer of compensation transistor; 311: channel region of the compensation transistor; 312: source contact region of the compensation transistor; 313: drain contact region of the compensation transistor; 320: gate layer of the compensation transistor; 400: data writing transistor; 410: active layer of data writing transistor; 411: channel region of data writing transistor; 412: source contact region of data writing transistor; 413: drain contact region of data writing transistor; 420: gate layer of data writing transistor; 430: source of data writing transistor; 440: drain of the data writing transistor; 500: storage capacitor; 510: first electrode plate; 511: first connecting lead; 520: second electrode plate; 600: pixel electrode; 601: second connecting lead; 710: first via hole; 720: second via hole; 810: first pixel drive circuit; 820: second pixel drive circuit; 830: third pixel drive circuit; 840: fourth pixel drive circuit; 850: fifth pixel drive circuit; A: overlapping region; 01: pixel; 011: pixel drive circuit; 012: light emitting element; 1000: display panel; 1001: array substrate; 1002: packaging film; 2000: drive circuit; 2001: gate drive circuit; 2002: source drive circuit.

DETAILED DESCRIPTION

Exemplary embodiments are described more comprehensively with reference to the accompanying drawings. However, the example embodiments can be implemented in various forms, and should not be construed as being limited to the examples set forth herein. On the contrary, the embodiments are provided to make the present disclosure more comprehensive and complete, and comprehensively convey the idea of the examples of the embodiments to those skilled in the art. The described features, structures, or characteristics may be combined in one or more embodiments in any appropriate manner. In the following description, specific details are provided to give a sufficient understanding of the embodiments of the present disclosure.

In the drawings, the thicknesses of the regions and layers may be exaggerated for clarity. The same reference numerals in the drawings denote the same or similar structures, and the detailed descriptions are omitted.

The terms "first" and "second" are only used as markers, and are not intended to limit the number of objects.

The backplane circuit of an OLED display device is complex, and a pixel electrode of a pixel drive circuit is prone to disconnection due to process factors or electrostatic discharge, which makes the pixel unable to emit light, seriously affecting the display effect.

An embodiment of the present disclosure provides an array substrate. As shown in FIG. 1, the array substrate includes a plurality of pixel drive circuits and an insulating layer (not shown in FIG. 1). For example, FIG. 1 shows a first pixel drive circuit 810 and a second pixel drive circuit 820. Each of the plurality of pixel drive circuits includes a drive transistor 200, a storage capacitor, and a pixel electrode 600. The drive transistor 200 includes a drain 240. The storage capacitor includes a first electrode plate 510, wherein the first electrode plate 510 is connected to the drain 240 of the drive transistor 200. The pixel electrode 600 is connected to the drain 240 of the drive transistor 200.

The plurality of pixel drive circuits includes a first pixel drive circuit 810 and a second pixel drive circuit 820 that are adjacent to each other, and the first electrode plate 510 of the first pixel drive circuit 810 and the pixel electrode 600 of the second pixel drive circuit 820 are laminated in an overlapping region A and isolated by the insulating layer.

In the array substrate according to the present disclosure, in response to poor contact occurs at the pixel electrode 600 of the first pixel drive circuit 810 or the second pixel drive circuit 820, the insulating layer in the overlapping region A may be removed. In this way, the pixel electrode 600 of the second pixel drive circuit 820 and the pixel electrode 600 of the first pixel drive circuit 810 are connected to the first electrode plate 510 of the first pixel drive circuit 810. Furthermore, the light emitting element driven by the second pixel drive circuit 820 is capable of emitting light together with the light emitting element driven by the first pixel drive circuit 810, which reduces the serious impact on the display effect caused that the light emitting element driven by the second pixel drive circuit 820 or the first pixel drive circuit 810 does not emit light.

The components of the array substrate according to the embodiments of the present disclosure are described in detail below in conjunction with the accompanying drawings:

The array substrate according to the present disclosure may include a base substrate, a drive circuit layer arranged on a side of the base substrate 110, and an organic luminescent layer arranged on a side, distal from the base substrate, of the drive circuit layer. The pixel drive circuits of the array substrate are arranged in an array in the drive circuit layer.

In each of the pixel drive circuits, as shown in FIG. 1, the drive transistor 200 may include a source 230, a gate and a drain 240. The source 230 and the drain 240 of the drive transistor 200 are configured to turn on or off under the control of a voltage of the gate of the drive transistor 200. The source 230 of the drive transistor and the drain 240 of the drive transistor may be of the same structure. In other cases, the connection relationship between the source 230 of the drive transistor and the drain 240 of the drive transistor is interchangeable. In other words, the drive transistor 200 may have a first connecting terminal, a second connecting terminal and a control terminal. One of the first connecting terminal and the second connecting terminal may serve as the source 230 of the drive transistor, and the other may serve as the drain 240 of the drive transistor, wherein the control terminal is the gate of the drive transistor 200.

Figure 3:
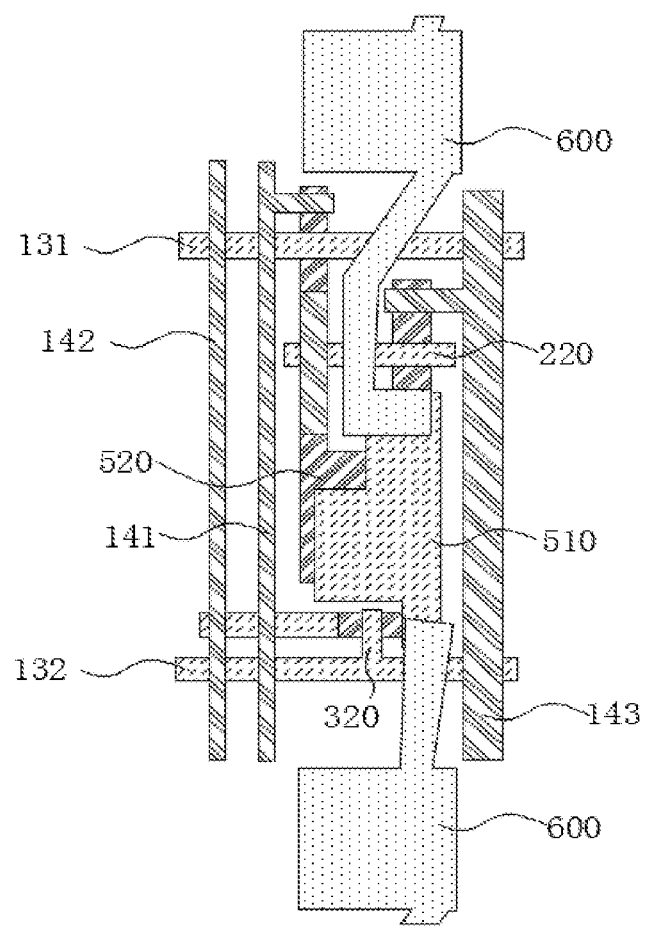
FIG. 3 is a schematic diagram of a hierarchical structure of a pixel drive circuit according to an embodiment of the present disclosure.
Figure 6:
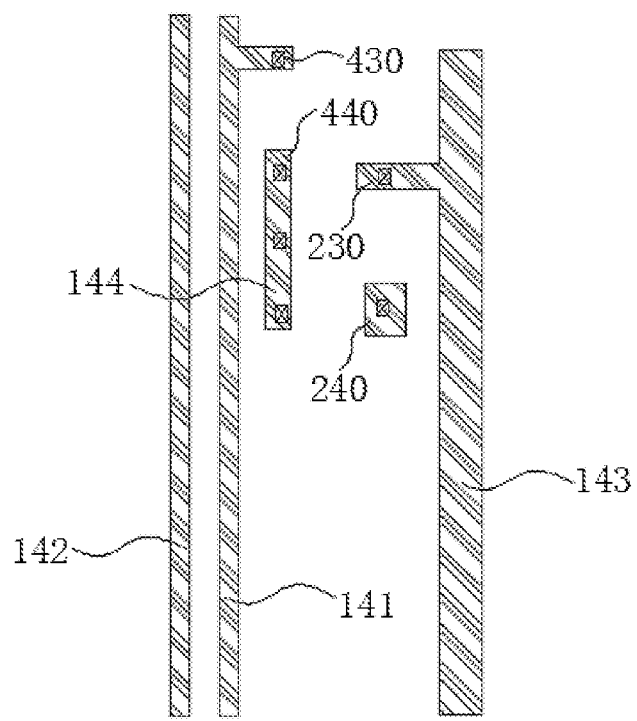
FIG. 6 is a schematic diagram showing a pattern of a source/drain material layer according to an embodiment of the present disclosure.

In an embodiment of the present disclosure, as shown in FIG. 3 (only an active material layer, a gate material layer, a source/drain material layer and an electrode material layer of the array substrate are shown) to FIG. 6, the drive transistor 200 may include an active layer 210 of the drive transistor arranged on a side of the base substrate, a gate insulating layer of the drive transistor arranged on a side, distal from the base substrate, of the active layer 210 of the drive transistor, a gate layer 220 of the drive transistor (serving as the gate of the drive transistor 200) arranged on a side, distal from the base substrate, of the gate insulating layer of the drive transistor, and the source 230 of the drive transistor and the drain 240 of the drive transistor which are connected to the active layer 210 of the drive transistor and insulated from each other.

Figure 4:
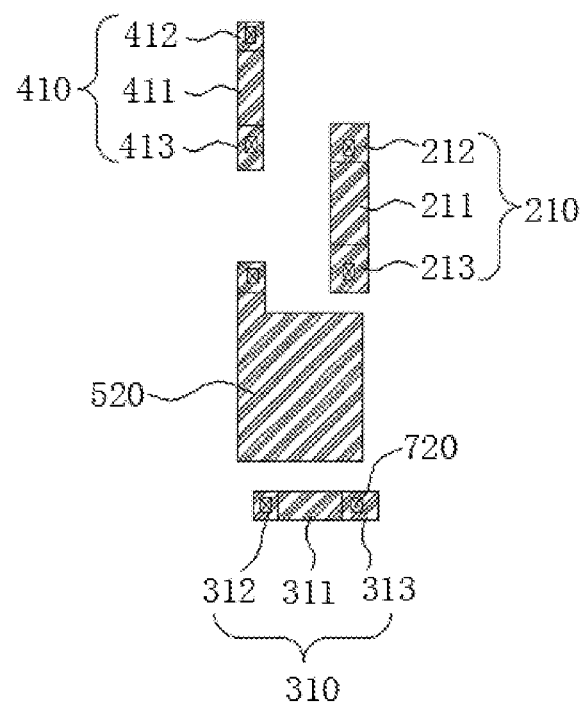
FIG. 4 is a schematic diagram showing a pattern of an active material layer according to an embodiment of the present disclosure.

Optionally, as shown in FIG. 4, the active layer 210 of the drive transistor may include a channel region 211 of the drive transistor and a source contact region 212 of the drive transistor and a drain contact region 213 of the drive transistor that are located on two sides of the channel region 211 of the drive transistor. The gate insulating layer of the drive transistor covers the channel region 211 of the drive transistor and at least partially exposes the source contact region 212 of the drive transistor and the drain contact region 213 of the drive transistor. The array substrate further includes an inter-layer dielectric layer. The inter-layer dielectric layer is arranged on a side, distal from the base substrate, of the gate layer 220 of the drive transistor. As shown in FIG. 6, the source 230 of the drive transistor is arranged on a side, distal from the base substrate, of the inter-layer dielectric layer and is connected to the source contact region 212 of the drive transistor through a via hole. The drain 240 of the drive transistor is arranged on the side, distal from the base substrate, of the inter-layer dielectric layer and is connected to the drain contact region 213 of the drive transistor through a via hole.

In other words, as shown in FIG. 3 to FIG. 6, the array substrate may include the base substrate, the active material layer, the first insulating material layer, the gate material layer, the inter-layer dielectric layer, and the source/drain material layer, which are successively laminated. The active material layer is formed with the active layer 210 of the drive transistor, the first insulating material layer is formed with the gate insulating layer of the drive transistor, the gate material layer is formed with the gate layer 220 of the drive transistor, and the source/drain material layer is formed with the source 230 of the drive transistor and the drain 240 of the drive transistor.

In each of the pixel drive circuits, as shown in FIG. 3, the storage capacitor may further include a second electrode plate 520 opposite to the first electrode plate 510, and a dielectric layer (not shown in FIG. 3) of the storage capacitor may be arranged between the first electrode plate 510 and the second electrode plate 520.

Figure 5:
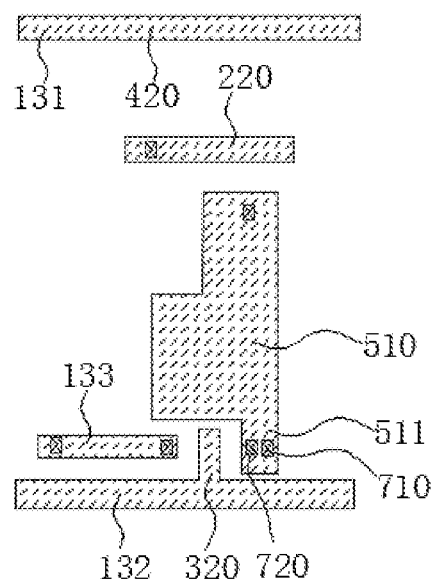
FIG. 5 is a schematic diagram showing a pattern of a gate material layer according to an embodiment of the present disclosure.

In an embodiment of the present disclosure, as shown in FIG. 3 to FIG. 5, the storage capacitor may include the second electrode plate 520 arranged on a side of the base substrate, a dielectric layer of the storage capacitor arranged on a side, distal from the base substrate, of the second electrode plate 520, and the first electrode plate 510 arranged on a side, distal from the base substrate, of the dielectric layer of the storage capacitor.

Optionally, as shown in FIG. 3 to FIG. 5, the second electrode plate 520 and the active layer 210 of the drive transistor may be arranged in the same layer and have the same material. The first electrode plate 510 and the gate layer 220 of the drive transistor may be arranged in the same layer and are made of the same material. The dielectric layer of the storage capacitor and the gate insulating layer of the drive transistor may be arranged in the same layer and have the same material.

In other words, as shown in FIG. 4 and FIG. 5, the active material layer may also include the second electrode plate 520, the first insulating material layer may also include the dielectric layer of the storage capacitor, and the gate material layer may also include the first electrode plate 510.

Figure 7:
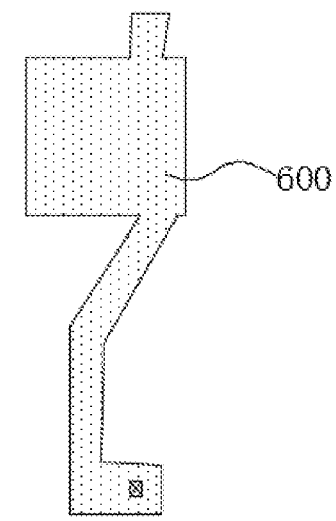
FIG. 7 is a schematic diagram showing a pattern of an electrode material layer according to an embodiment of the present disclosure.
Figure 7:
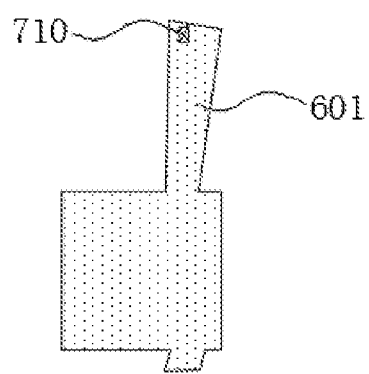

As shown in FIG. 3 and FIG. 7, in the array substrate, an electrode material layer for forming the pixel electrode 600 may be arranged on a side, distal from the base substrate, of the drive transistor 200, and the pixel electrode 600 is configured to electrically connect to a light emitting element arranged in an organic luminescent layer. The light emitting element may be an OLED, which may include a hole transport layer arranged on a side of an anode, an organic electroluminescent layer arranged on a side, distal from the anode, of the hole transport layer, and an electron transport layer arranged on a side, distal from the anode, of the organic electroluminescent layer, and a side, distal from the anode, of the electron transport layer cooperates with the cathode. Optionally, the anode may be the pixel electrode 600 of the array substrate, and the cathode may be a common electrode arranged on a side, distal from the base substrate, of the organic luminescent layer.

The drive circuit layer of the array substrate may further be provided with source/drain-layer leads and gate lines. The source/drain-layer leads and the source 230 of the driving transistor may be arranged in the same layer and are made of the same material, and the gate line and the gate of the driving transistor 200 may be arranged in the same layer and have the same material.

Figure 2:
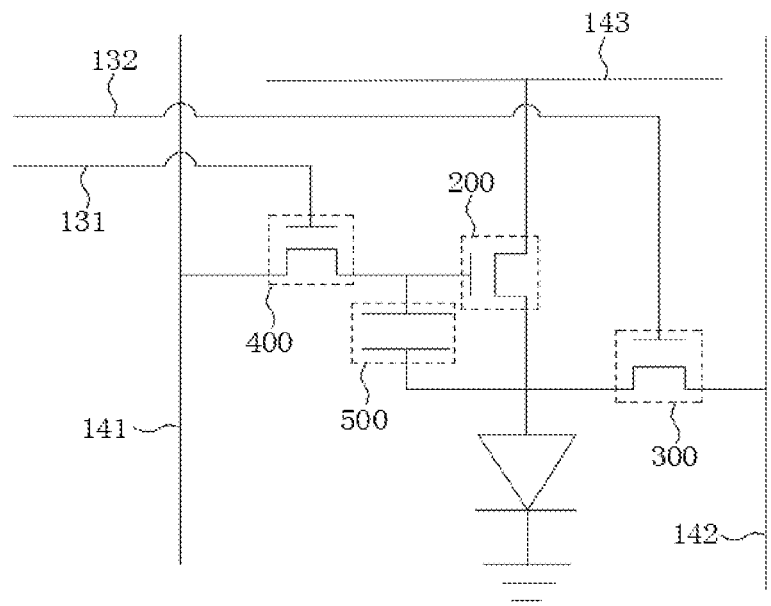
FIG. 2 is a schematic diagram of a pixel drive circuit according to an embodiment of the present disclosure.

As shown in FIG. 2 and FIG. 3, the source/drain-layer leads may include a data line 141 and a power line 143. The data line 141 is configured to load a data signal to the pixel drive circuit, and the power line 143 is configured to load a supply voltage to the pixel drive circuit. The gate line may include a first gate line 131 configured to load a first control signal to the pixel drive circuit. Definitely, in different pixel drive circuits, the source/drain-layer leads and the gate lines may also include other leads.

For example, as shown in FIG. 2 to FIG. 6, each the pixel drive circuits may further include a compensation transistor 300 and a data writing transistor 400, the source/drain-layer leads may further include a compensation line 142, and the gate lines may further include a second gate line 132. A source 430 of the data writing transistor is connected to the data line 141, a drain 440 of the data writing transistor is connected to the gate of the drive transistor 200 and the second electrode plate 520 of the storage capacitor 500, and a gate of the data writing transistor is connected to the first gate line 131. A source of the compensation transistor 300 is electrically connected to the compensation line 142, a drain of the compensation transistor 300 is connected to the first electrode plate 510 of the storage capacitor 500, and a gate of the compensation transistor 300 is connected to the second gate line 132. The source 230 of the drive transistor is electrically connected to the power line 143, and the drain 240 of the drive transistor is connected to the first electrode plate 510 of the storage capacitor 500 and the pixel electrode 600.

Optionally, as shown in FIG. 6, the data line 141, the power line 143, and the compensation line 142 are formed in the source/drain material layer. As shown in FIG. 5, the first gate line 131 and the second gate line 132 are formed in the gate material layer. In other words, the source/drain material layer further includes the data line 141, the power line 143, and the compensation line 142; the gate material layer further includes the first gate line 131 and the second gate line 132.

Optionally, as shown in FIG. 3 and FIG. 6, the source/drain material layer may also include a third connecting lead 144. The third connecting lead 144 is connected to the drain 440 of the data writing transistor through a via hole, the third connecting lead 144 is connected to the second electrode plate 520 of the storage capacitor 500 through a via hole, and the third connecting lead 144 is connected to the gate layer 220 of the drive transistor through a via hole.

In an embodiment of the present disclosure, as shown in FIG. 3 to FIG. 6, the compensation transistor 300 may include an active layer 310 of the compensation transistor arranged on a side of the base substrate, a gate insulating layer of the compensation transistor arranged on a side, distal from the base substrate, of the active layer 310 of the compensation transistor, and a gate layer 320 of the compensation transistor (serving as the gate of the compensation transistor 300) arranged on a side, distal from the base substrate, of the gate insulating layer of the compensation transistor. The active layer 310 of the compensation transistor may include a channel region 311 of the compensation transistor, and a source contact region 312 and a drain contact region 313 of the compensation transistor that are located on two sides of the channel region 311 of the compensation transistor. The gate insulating layer of the compensation transistor covers the channel region 311 of the compensation transistor, and at least partially exposes the source contact region 312 of the compensation transistor and the drain contact region 313 of the compensation transistor. The source contact region 312 of the compensation transistor may serve as the source of the compensation transistor 300, and is configured to be point-to-point connected to the compensation line 142. The drain contact region 313 of the compensation transistor may serve as the drain of the compensation transistor 300, and is configured to be connected to the first electrode plate 510.

As such, as shown in FIG. 4 to FIG. 6, the active material layer may further include the active layer 310 of the compensation transistor; the first insulating layer may further include the insulating layer of the gate of the compensation transistor; and the gate material layer may further include the gate layer 320 of the compensation transistor.

Optionally, as shown in FIG. 3 and FIG. 5, the gate material layer may further include a fourth connecting lead 133, the fourth connecting lead 133 is connected to the source contact region 312 of the compensation transistor through a via hole, and the fourth connecting lead 133 is connected to the compensation line 142 through a via hole.

In an embodiment of the present disclosure, as shown in FIG. 3 to FIG. 6, the data writing transistor 400 may include an active layer 410 of the data writing transistor arranged on a side of the base substrate, a gate insulating layer of the data writing transistor arranged on a side, distal from the base substrate, of the active layer 410 of the data writing transistor, a gate layer 420 of the data writing transistor (serving as the gate of the data writing transistor 400) arranged on the side, distal from the base substrate, of the gate insulating layer of the data writing transistor 400, and the source 430 and the drain 440 of the data writing transistor which are connected to the active layer 410 of the data writing transistor and insulated from each other.

Optionally, as shown in FIG. 3 to FIG. 6, the active layer 410 of the data writing transistor may include a channel region 411 of the data writing transistor and a source contact region 412 of the data writing transistor and a drain contact region 413 of the data writing transistor that are located on two sides of the channel region 411 of the data writing transistor. The gate insulating layer of the data writing transistor covers the channel region 411 of the data writing transistor, and at least partially exposes the source contact region 412 and the drain contact region 413 of the data writing transistor. The inter-layer dielectric layer is arranged on a side, distal from the base substrate, of the gate layer 420 of the data writing transistor. The source 430 of the data writing transistor is arranged on a side, distal from the base substrate, of the inter-layer dielectric layer, and is connected to the source contact region 412 of the data writing transistor through a via hole. The drain 440 of the data writing transistor is arranged on the side, distal from the base substrate, of the inter-layer dielectric layer, and is connected to the drain contact region 413 of the data writing transistor through a via hole.

In other words, the active material layer may further include the active layer 410 of the data writing transistor; the gate material layer may further include the gate layer 420 of the data writing transistor; and the source/drain material layer may further include the source 430 and the drain 440 of the data writing transistor.

Figure 8:
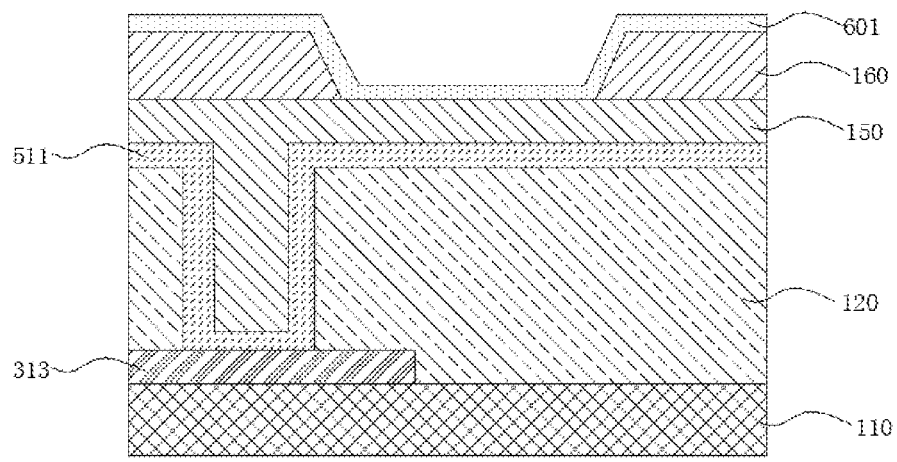
FIG. 8 is a schematic structural cross-sectional view of an overlapping region according to an embodiment of the present disclosure.

In an embodiment of the present disclosure, as shown in FIG. 1 and FIG. 5, the first electrode plate 510 may include a first connecting lead 511. As shown in FIG. 1 and FIG. 7, the pixel electrode 600 may include a second connecting lead 601. The first connecting lead 511 of the first pixel drive circuit 810 and the second connecting lead 601 of the second pixel drive circuit 820 are laminated in the overlapping region A and isolated by the insulating layer. That is, the first electrode plate 510 of the first pixel drive circuit 810 may include the first connecting lead 511 extending to the overlapping region A, and the pixel electrode 600 of the second pixel drive circuit 820 may include the second connecting lead 601 extending to the overlapping region A. In the overlapping region A, the first connecting lead 511 and the second connecting lead 601 may be laminated with each other and isolated by the insulating layer. As such, as shown in FIG. 8, the array substrate may include the base substrate 110, the first connecting lead 511 of the first pixel drive circuit, the insulating layer, and the second connecting lead 601 of the second pixel drive circuit, which are successively laminated in the overlapping region A. Where the pixel electrode 600 of the first pixel drive circuit 810 and the pixel electrode 600 of the second pixel drive circuit 820 need be electrically connected to each other, the insulating layer in the overlapping region A may be removed by laser, such that the first connecting lead 511 is in electric contact with the second connecting lead 601.

In an embodiment of the present disclosure, as shown in FIG. 8, the drive circuit layer of the array substrate may further include a second insulating material layer arranged on a side, distal from the base substrate 110, of the gate material layer, wherein the second insulating material layer may include a protective layer 150 (PVX) of the drive circuit layer. Optionally, the protective layer 150 is arranged on a side, distal from the base substrate 110, of the drive transistor 200. Further, the drive circuit layer of the array substrate may further include a third insulating material layer arranged on a side, distal from the base substrate 110, of the second insulating material layer, wherein the third insulating material layer may be formed with a planarization layer 160 of the drive circuit layer of the array substrate. The pixel electrode 600 may be arranged on a side, distal from the base substrate 110, of the planarization layer 160 and connected to the drain 240 of the drive transistor through a via hole.

The insulating layer separating the first electrode plate from the pixel electrode in the overlapping region may be either or both of the protective layer 150 and the planarization layer 160. For example, as shown in FIG. 8, in the overlapping region A, the planarization layer 160 and the protective layer 150 are arranged between the first connecting lead 511 and the second connecting lead 601, and the planarization layer 160 includes a first via hole 710 exposing the protective layer 150. In this way, the protective layer 150 serves as the insulating layer to isolate the first connecting lead 511 from the second connecting lead 601. The configuration of the first via hole 710 reduces the amount of the isolation material required between the first connecting lead 511 and the second connecting lead 601, which facilitates removal of the isolation material between the first connecting lead 511 and the second connecting lead 601 by such a method as laser fusing. In this embodiment, the protective layer 150 includes the insulating layer.

Optionally, as shown in FIG. 8, the drain contact region 313 of the compensation transistor of the first pixel drive circuit 810 may also extend to the overlapping region A. The first insulating material layer 120 arranged on a side, distal from the base substrate 110, of the drain contact region 313 of the compensation transistor has a second via hole 720 exposing the drain contact region 313 of the compensation transistor, such that the drain contact region 313 of the compensation transistor and the first connecting lead 511 of the first pixel drive circuit 810 are connected through the second via hole 720, to realize electrical connection between the drain of the compensation transistor 300 and the first electrode plate 510.

The drive circuit layer includes a first pixel drive circuit 810 and a second pixel drive circuit that are adjacent to each other, and the first electrode plate 510 of the first pixel drive circuit 810 and the pixel electrode 600 of the second pixel drive circuit 820 are laminated in an overlapping region A and isolated by the insulating layer. It is understandable that in the drive circuit layer, there are a plurality of overlapping regions A, and each of the overlapping regions corresponds to two adjacent pixel drive circuits. In other words, one overlapping region is arranged in correspondence with two adjacent pixel drive circuits, and in the two pixel drive circuits, the first electrode plate 510 of one pixel drive circuit and the pixel electrode 600 of the other pixel drive circuit are laminated in the corresponding overlapping region A and isolated by an insulating layer.

Figure 9:
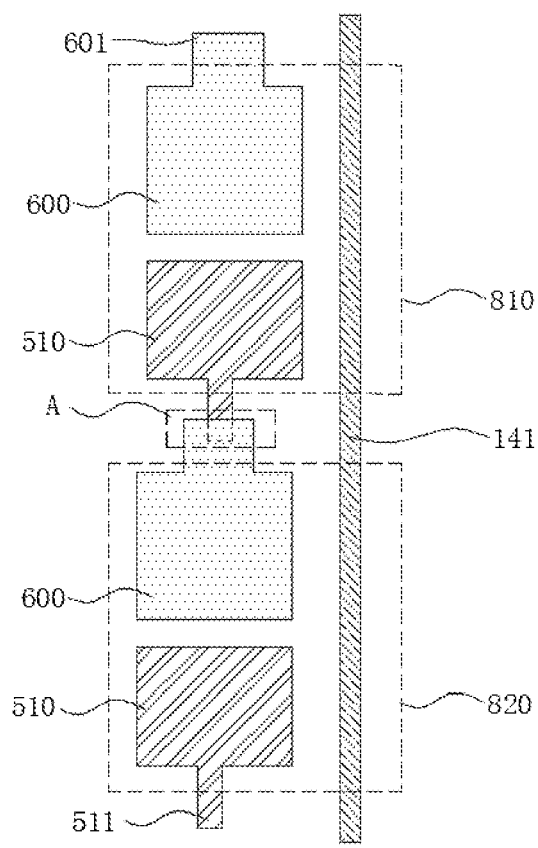
FIG. 9 is a schematic structural diagram showing an arrangement of a first pixel drive circuit and a second pixel drive circuit according to an embodiment of the present disclosure.

In an embodiment of the present disclosure, as shown in FIG. 9, the first pixel drive circuit 810 and the second pixel drive circuit 820 may be arranged along an extending direction of the data line 141 of the array substrate. Thus, the two adjacent pixel drive circuits arranged along the extending direction of the data line 141 of the array substrate can be paired with each other, such that when poor contact occurs at the pixel electrode 600 of one pixel drive circuit, a connection operation may be performed in the overlapping region A corresponding to the paired two pixel drive circuits. For example, the insulating layer in the overlapping region A is removed by laser such that the first electrode plate 510 and the pixel electrode 600 in the overlapping region A are electrically connected to each other, and therefore the pixel electrodes 600 of the two pixel drive circuits are electrically connected to each other to emit light at the same time.

Figure 10:
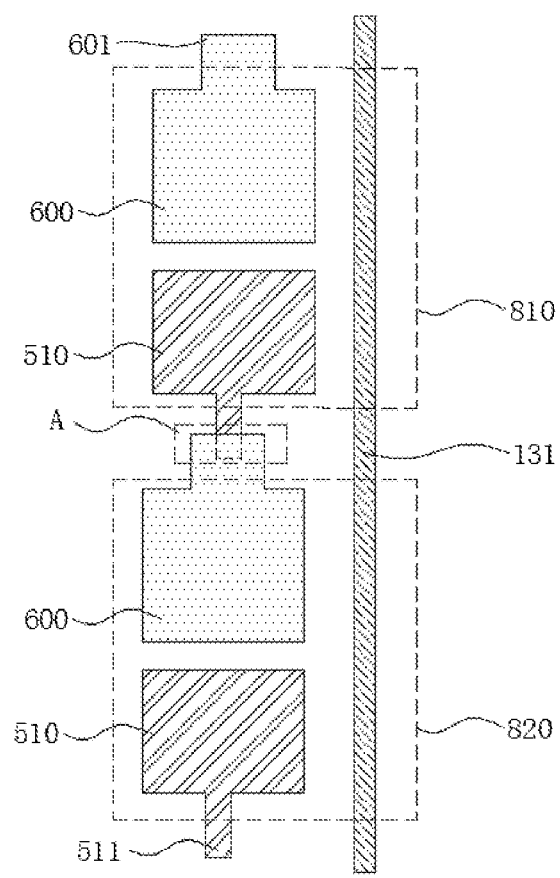
FIG. 10 is a schematic structural diagram showing an arrangement of a first pixel drive circuit and a second pixel drive circuit according to an embodiment of the present disclosure.

In another embodiment of the present disclosure, as shown in FIG. 10, the first pixel drive circuit 810 and the second pixel drive circuit 820 are arranged along an extending direction of the gate line 131 of the array substrate. Thus, the two adjacent pixel drive circuits arranged along the extending direction of the gate line of the array substrate can be paired with each other, such that when poor contact occurs at the pixel electrode 600 of one of the paired two pixel drive circuits, a connection operation may be performed in the overlapping region A corresponding to the paired two pixel drive circuits. For example, the insulating layer in the overlapping region A is removed by laser such that the first electrode plate 510 and the pixel electrode 600 in the overlapping region A are electrically connected to each other, and therefore the pixel electrodes 600 of the two pixel drive circuits are electrically connected to each other to emit light at the same time.

Definitely, a pixel drive circuit may be paired with one adjacent pixel drive circuit, and may also be paired with a plurality of pixel drive circuits nearby.

Figure 11:
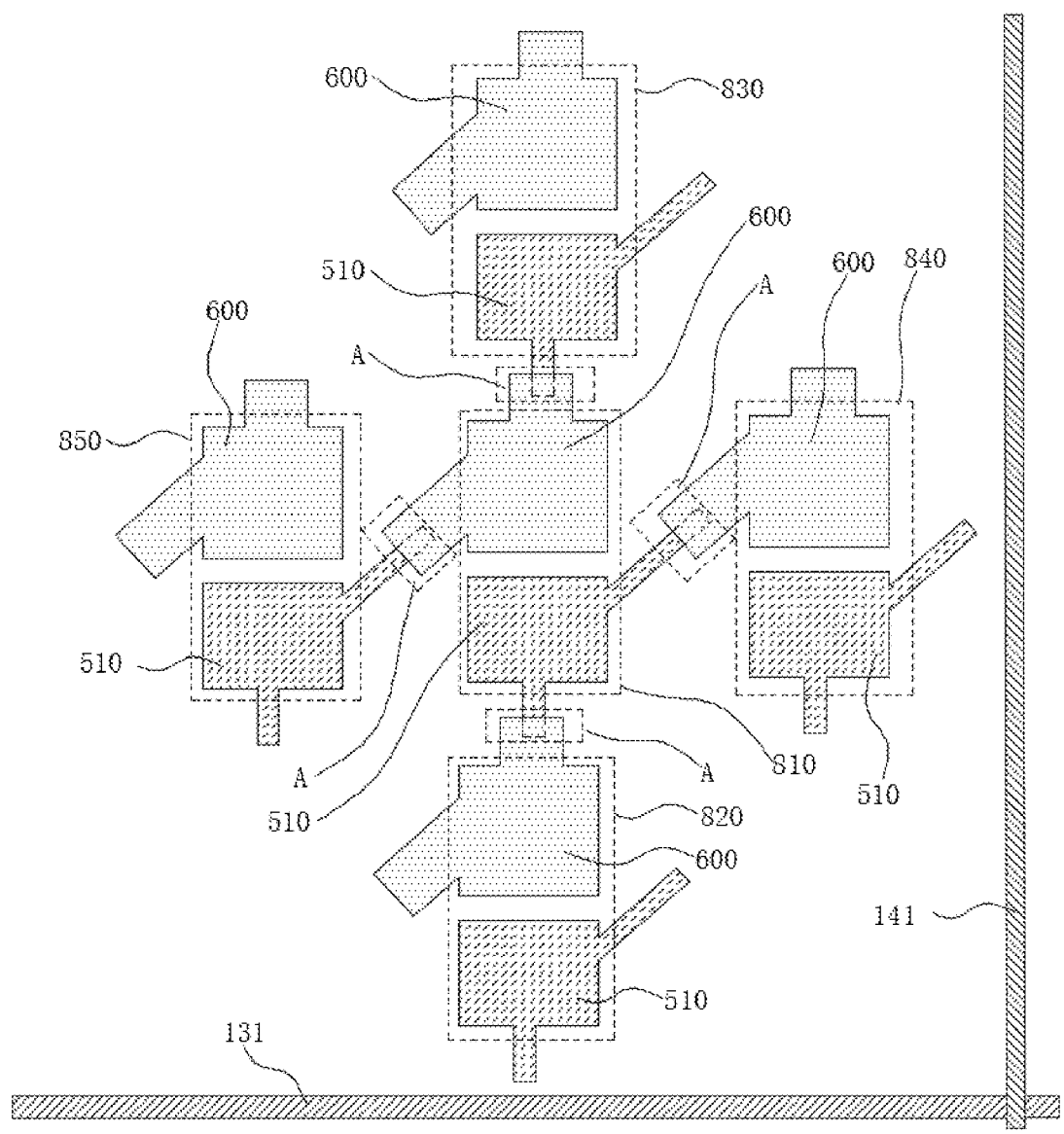
FIG. 11 is a schematic structural diagram showing an arrangement of a plurality of pixel drive circuits according to an embodiment of the present disclosure.

For example, in another embodiment of the present disclosure, as shown in FIG. 11, the plurality of pixel drive circuits further include at least one of a third pixel drive circuit 830, a fourth pixel drive circuit 840, and a fifth pixel drive circuit 850 that are adjacent to the first pixel drive circuit 810. For example, FIG. 11 shows the third pixel drive circuit 830, the fourth pixel drive circuit 840, and the fifth pixel drive circuit 850 that are adjacent to the first pixel drive circuit 810.

The second pixel drive circuit 820, the first pixel drive circuit 810, and the third pixel drive circuit 830 are arranged successively along the extending direction of the data line 141 of the array substrate. The fourth pixel drive circuit 840, the first pixel drive circuit 810, and the fifth pixel drive circuit 850 are arranged along the extending direction of the gate line of the array substrate. The pixel electrode 600 of the first pixel drive circuit 810 and the first electrode plate 510 of the third pixel drive circuit 830 are further laminated in an overlapping region A and isolated by an insulating layer. The first electrode plate 510 of the first pixel drive circuit 810 and the pixel electrode 600 of the fourth pixel drive circuit 840 are further laminated in an overlapping region A and isolated by an insulating layer. The pixel electrode 600 of the first pixel drive circuit 810 and the first electrode plate 510 of the fifth pixel drive circuit 850 are further laminated in an overlapping region A and isolated by an insulating layer.

In this way, according to FIG. 11, the first electrode plate 510 of the first pixel drive circuit 810 can be matched with the pixel electrode 600 of the second pixel drive circuit 820 and the pixel electrode 600 of the fourth pixel drive circuit 840 at the same time. In response to occurrence of open failures at the pixel electrode 600 of the first pixel drive circuit 810, the first electrode plate 510 of the first pixel drive circuit 810 may be electrically connected to the pixel electrode 600 of the second pixel drive circuit 820 or the pixel electrode 600 of the fourth pixel drive circuit 840, such that the light emitting element driven by the first pixel drive circuit 810 is capable of emitting light.

In addition, according to FIG. 11, the pixel electrode 600 of the first pixel drive circuit 810 can also be matched with the first electrode plate 510 of the third pixel drive circuit 830 and the first electrode plate 510 of the fifth pixel drive circuit 850 at the same time. In response to occurrence of open failures at the pixel electrode 600 of the first pixel drive circuit 810, the pixel electrode 600 of the first pixel drive circuit 810 may be electrically connected to the first electrode plate 510 of the third pixel drive circuit 830 or the first electrode plate 510 of the fifth pixel drive circuit 850, such that the light emitting element driven by the first pixel drive circuit 810 is capable of emitting light.

For example, in another embodiment of the present disclosure, the plurality of pixel drive circuits further include a third pixel drive circuit 830, a fourth pixel drive circuit 840, and a fifth pixel drive circuit 850 that are adjacent to the first pixel drive circuit 810.

The second pixel drive circuit 820, the first pixel drive circuit 810, and the third pixel drive circuit 830 are arranged successively along the extending direction of the data line 141 of the array substrate. The fourth pixel drive circuit 840, the first pixel drive circuit 810, and the fifth pixel drive circuit 850 are arranged along the extending direction of the gate line of the array substrate. The first electrode plate 510 of the first pixel drive circuit 810 is laminated in different overlapping regions A with the pixel electrode 600 of the third pixel drive circuit 830, the pixel electrode 600 of the fourth pixel drive circuit 840, and the pixel electrode 600 of the fifth pixel drive circuit 850 and isolated by an insulating layer.

In this way, the first electrode plate 510 of the first pixel drive circuit 810 can be paired with the pixel electrodes 600 of the four the pixel drive circuits nearby at the same time, that is, a corresponding overlapping region A may be arranged between the first pixel drive circuit 810 and the four pixel drive circuits nearby the first pixel drive circuit 810. In response to poor contact occurs at the pixel electrode 600 of the first pixel drive circuit 810, the first electrode plate 510 of the first pixel drive circuit 810 may be electrically connected to the pixel electrode 600 of each of the four pixel drive circuits nearby the first pixel drive circuit 810, such that the light emitting element driven by the first pixel drive circuit 810 is capable of emitting light.

Figure 12:
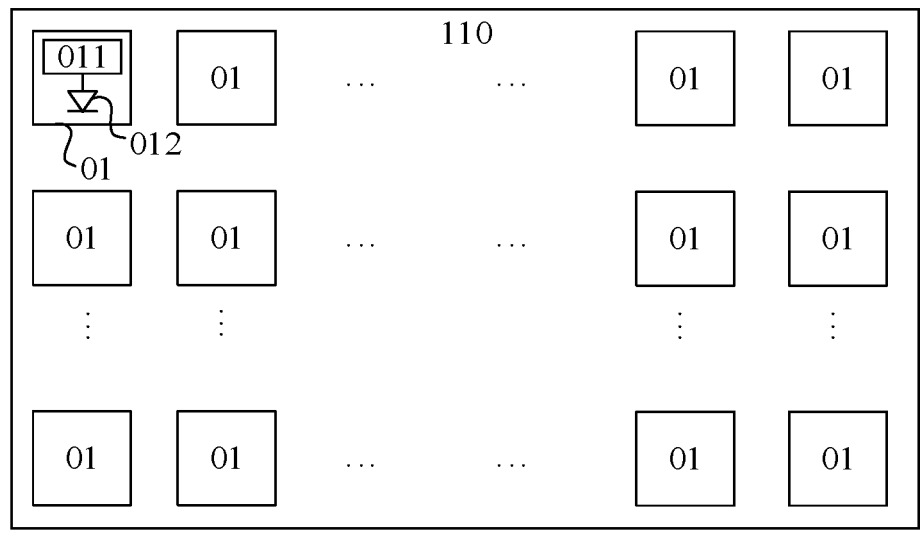
FIG. 12 is a schematic structural diagram of an array substrate according to an embodiment of the present disclosure.

As shown in FIG. 12, in another embodiment of the present disclosure, the array substrate may include a plurality of pixels 01 arranged in an array, wherein each of the pixels 01 includes any pixel drive circuit 011 as described above and a light emitting element 012 connected to the pixel drive circuit 011. The light emitting element 012 may be an OLED.

Figure 13:
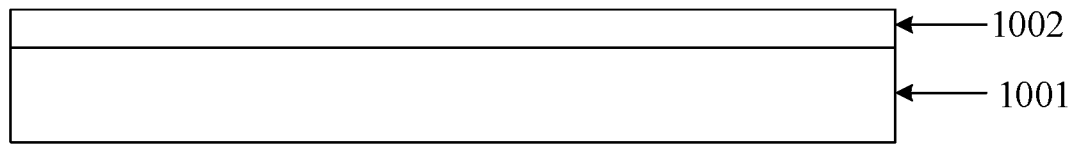
FIG. 13 is a schematic structural diagram of a display panel according to an embodiment of the present disclosure.

An embodiment of the present disclosure further provides a display panel. As shown in FIG. 13, the display panel includes any array substrate 1001 as described in the above embodiment of the array substrate, and a packaging film 1002 configured to package the array substrate 1001.

Optionally, the display panel may be an OLED array substrate, a PLED array substrate or any other type of display panel. Because the display panel includes any of the array substrates as described in the above embodiment of the array substrate, the array substrates have the same beneficial effects, which are not described herein any further.

Figure 14:
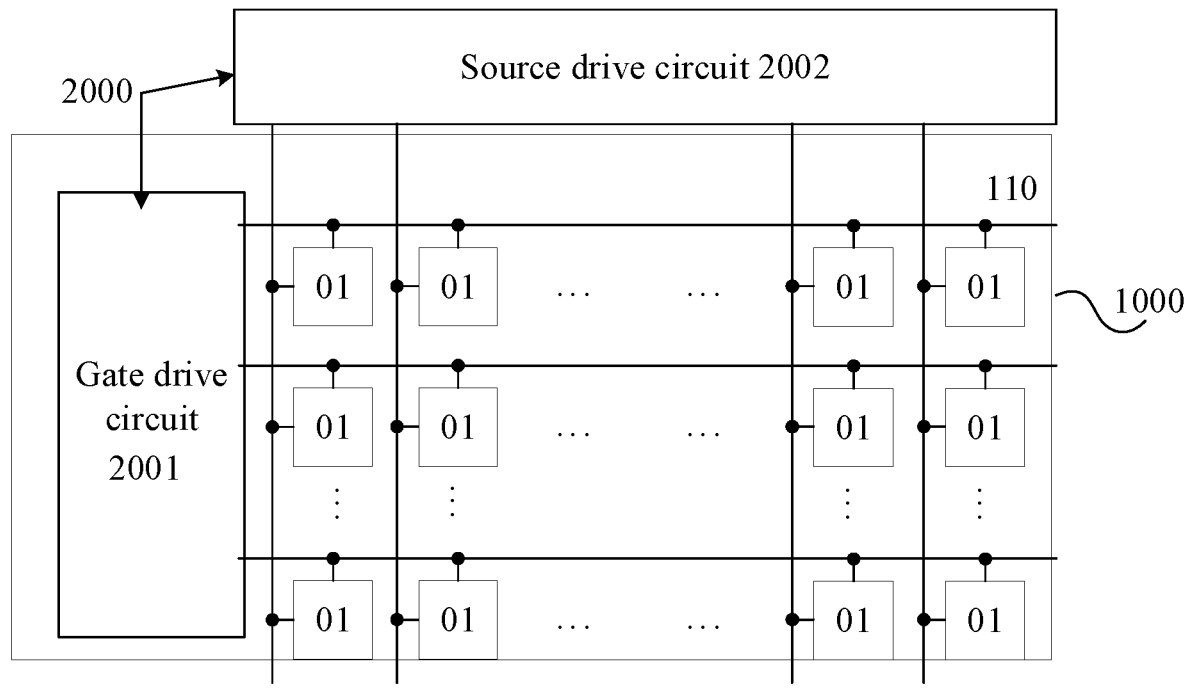
FIG. 14 is a schematic structural diagram of a display device according to an embodiment of the present disclosure.

An embodiment of the present disclosure further provides a display device. As shown in FIG. 14, the display device includes any display panel 1000 as described in the above embodiment of the display panel, and a drive circuit 2000 connected to the display panel 1000. Optionally, referring to FIG. 14, the drive circuit 2000 may include a gate drive circuit 2001 and a source drive circuit 2002. The gate drive circuit 2001 may be connected to each row of pixels 01 to provide a gate drive signal to each row of pixels 01. The source drive circuit 2002 may be connected to each column of pixels 01 to provide a data signal to each column of pixels 01.

Optionally, as shown in FIG. 14, the gate drive circuit 2001 may be arranged on the array substrate of the display panel 1000.

Optionally, the display device may be a notebook computer, a television, a mobile phone or any other type of display device. Because the display device has any of the display panels as described in the above embodiment of the display panel, the display panels have the same beneficial effects, which are not described herein any further.

It should be understood that the term "and/or" can indicate three kinds of relationship. For example, A and/or B, can be expressed as: A exists alone, A and B exist concurrently, B exists alone. The symbol "/" generally indicates an "OR" relationship between contextual objects.

It should be understood that the present disclosure does not limit its application to the detailed structures and configurations of the components proposed in this specification. The present disclosure can have other embodiments, and can be implemented and executed in various ways. The variations and modifications fall within the scope of the present disclosure. It should be understood that the present disclosure disclosed and defined in this specification extends to all alternative combinations of two or more individual features mentioned or obvious in this specification and/or the accompanying drawings. All these different combinations constitute various alternative aspects of the present disclosure. The embodiments described in this specification illustrate exemplary ways known to implement the present disclosure, and will enable those skilled in the art to utilize the present disclosure.

What is claimed is:

1. An array substrate, comprising a plurality of pixel drive circuits and an insulating layer; wherein each of the pixel drive circuits comprises:
   a drive transistor comprising a drain;
   a storage capacitor comprising a first electrode plate, wherein the first electrode plate being connected to the drain of the drive transistor; and
   a pixel electrode connected to the drain of the drive transistor;
   wherein the plurality of pixel drive circuits comprise a first pixel drive circuit and a second pixel drive circuit that are adjacent to each other, wherein the first electrode plate of the first pixel drive circuit and the pixel electrode of the second pixel drive circuit are laminated in an overlapping region and isolated by the insulating layer; and
   wherein the first electrode plate of the first pixel drive circuit comprises a first connecting lead, and the pixel electrode of the second pixel drive circuit comprises a second connecting lead, the first connecting lead of the first pixel drive circuit and the second connecting lead of the second pixel drive circuit are laminated in the overlapping region and isolated by the insulating layer, each of the pixel drive circuits further comprises a compensation transistor, a drain contact region of the compensation transistor of the first pixel drive circuit extends to the overlapping region, wherein the drain contact region of the compensation transistor is connected to the first connecting lead, and a source of the compensation transistor is connected to the compensation line.

2. The array substrate according to claim 1, wherein the first pixel drive circuit and the second pixel drive circuit are arranged along an extending direction of a data line of the array substrate.

3. The array substrate according to claim 1, wherein the first pixel drive circuit and the second pixel drive circuit are arranged along an extending direction of a gate line of the array substrate.

4. The array substrate according to claim 1, wherein the plurality of pixel drive circuits further comprise at least one of a third pixel drive circuit, a fourth pixel drive circuit, and a fifth pixel drive circuit that are adjacent to the first pixel drive circuit; wherein
   the second pixel drive circuit, the first pixel drive circuit, and the third pixel drive circuit are arranged successively along an extending direction of a data line of the array substrate;
   the fourth pixel drive circuit, the first pixel drive circuit, and the fifth pixel drive circuit are arranged along an extending direction of a gate line of the array substrate;
   the pixel electrode of the first pixel drive circuit and the first electrode plate of the third pixel drive circuit are further laminated in an overlapping region and isolated by the insulating layer;
   the first electrode plate of the first pixel drive circuit and the pixel electrode of the fourth pixel drive circuit are further laminated in an overlapping region and isolated by the insulating layer; and
   the pixel electrode of the first pixel drive circuit and the first electrode plate of the fifth pixel drive circuit are further laminated in an overlapping region and isolated by the insulating layer.

5. The array substrate according to claim 1, wherein the plurality of pixel drive circuits further comprise at least one of a third pixel drive circuit, a fourth pixel drive circuit, and a fifth pixel drive circuit that are adjacent to the first pixel drive circuit; wherein
   the second pixel drive circuit, the first pixel drive circuit, and the third pixel drive circuit are arranged successively along an extending direction of a data line of the array substrate;
   the fourth pixel drive circuit, the first pixel drive circuit, and the fifth pixel drive circuit are arranged successively along an extending direction of a gate line of the array substrate; and
   the first electrode plate of the first pixel drive circuit is laminated in different overlapping regions with the pixel electrode of the third pixel drive circuit, the pixel electrode of the fourth pixel drive circuit, and the pixel electrode of the fifth pixel drive circuit and isolated by the insulating layer.

6. The array substrate according to claim 1, further comprising:
   an active material layer, arranged on a side of the base substrate, wherein the active material layer comprises a second electrode plate of the storage capacitor and an active layer of the drive transistor.

7. The array substrate according to claim 6, wherein the array substrate further comprises:
   a first insulating material layer, arranged on a side, distal from the base substrate, of the active material layer, wherein the first insulating material comprises a dielectric layer of the storage capacitor and a gate insulating layer of the drive transistor.

8. The array substrate according to claim 7, further comprising:
   a gate material layer, arranged on a side, distal from the base substrate, of the first insulating material layer distant from the base substrate, wherein the gate material layer comprises a gate of the drive transistor and the first electrode plate of the storage capacitor.

9. The array substrate according to claim 8, further comprising:
a source/drain material layer, arranged on a side, distal from the base substrate, of the gate material layer, wherein the source/drain material layer comprises the drain of the drive transistor.

10. The array substrate according to claim 8, further comprising:
a second insulating material layer, arranged on the side, distal from the base substrate, of the gate material layer, wherein the second insulating material layer comprises a protective layer comprising the insulating layer.

11. The array substrate according to claim 8, wherein the pixel drive circuit further comprises: a data writing transistor; and a drain of the data writing transistor is connected to the gate of the drive transistor and the second electrode plate of the storage capacitor.

12. The array substrate according to claim 10, further comprising:
a third insulating material layer, arranged on a side, distal from the base substrate, of the second insulating material layer, wherein the third insulating material layer comprises the planarization layer.

13. The array substrate according to claim 12, further comprising:
an electrode material layer, arranged on a side, distal from the base substrate, of the planarization layer, wherein the electrode material layer comprises the pixel electrode.

14. The array substrate according to claim 1, further comprising:
a plurality of pixels, wherein each of the pixels comprises a pixel drive circuit and a light emitting element connected to the pixel drive circuit.

15. The array substrate according to claim 1, further comprising a base substrate; wherein
the first connecting lead of the first pixel drive circuit is arranged on a side of the base substrate;
the insulating layer is arranged on a side, distal from the base substrate, of the first connecting lead of the first pixel drive circuit; and
the second connecting lead of the second pixel drive circuit is arranged on a side, distal from the base substrate, of the insulating layer.

16. The array substrate according to claim 15, further comprising:
a planarization layer, arranged between the insulating layer and the second connecting lead of the second pixel drive circuit; wherein
the planarization layer comprises a first via hole exposing the insulating layer; and
the second connecting lead of the second pixel drive circuit covers the insulating layer exposed by the first via hole.

17. A display panel, comprising an array substrate and a packaging film configured to package the array substrate, wherein the array substrate comprises a plurality of pixel drive circuits and an insulating layer; wherein each of the pixel drive circuits comprises:
a drive transistor comprising a drain;
a storage capacitor comprising a first electrode plate, wherein the first electrode plate being connected to the drain of the drive transistor; and
a pixel electrode connected to the drain of the drive transistor;
wherein the plurality of pixel drive circuits comprise a first pixel drive circuit and a second pixel drive circuit that are adjacent to each other, wherein the first electrode plate of the first pixel drive circuit and the pixel electrode of the second pixel drive circuit are laminated in an overlapping region and isolated by the insulating layer; and
wherein the first electrode plate of the first pixel drive circuit comprises a first connecting lead, and the pixel electrode of the second pixel drive circuit comprises a second connecting lead, the first connecting lead of the first pixel drive circuit and the second connecting lead of the second pixel drive circuit are laminated in the overlapping region and isolated by the insulating layer, each of the pixel drive circuits further comprises a compensation transistor, a drain contact region of the compensation transistor of the first pixel drive circuit extends to the overlapping region, wherein the drain contact region of the compensation transistor is connected to the first connecting lead, and a source of the compensation transistor is connected to the compensation line.

18. A display device, comprising the display panel as defined in claim 17 and a drive circuit connected to the display panel, wherein the display panel comprises an array substrate and a packaging film configured to package the array substrate, wherein the array substrate comprises a plurality of pixel drive circuits and an insulating layer; wherein each of the pixel drive circuits comprises:
a drive transistor comprising a drain;
a storage capacitor comprising a first electrode plate, wherein the first electrode plate being connected to the drain of the drive transistor; and
a pixel electrode connected to the drain of the drive transistor;
wherein the plurality of pixel drive circuits comprise a first pixel drive circuit and a second pixel drive circuit that are adjacent to each other, wherein the first electrode plate of the first pixel drive circuit and the pixel electrode of the second pixel drive circuit are laminated in an overlapping region and isolated by the insulating layer.

* * * * *